United States Patent
Fujiki et al.

(10) Patent No.: US 6,835,331 B2
(45) Date of Patent: Dec. 28, 2004

(54) CONDUCTIVE COMPOSITION

(75) Inventors: Hironao Fujiki, Gunma-ken (JP); Motoo Fukushima, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 237 days.

(21) Appl. No.: 10/196,216

(22) Filed: Jul. 17, 2002

(65) Prior Publication Data

US 2003/0107026 A1 Jun. 12, 2003

(30) Foreign Application Priority Data

Jul. 17, 2001 (JP) ........................................ 2001-216640

(51) Int. Cl.$^7$ ................................................. H01B 1/24
(52) U.S. Cl. ...................................... 252/512; 252/514
(58) Field of Search ................................ 252/512, 513, 252/514

(56) References Cited

U.S. PATENT DOCUMENTS

| | | | |
|---|---|---|---|
| 5,173,765 A | | 12/1992 | Nakayoshi et al. |
| 5,378,533 A | * | 1/1995 | Ota ........................... 428/304.4 |
| 5,384,075 A | | 1/1995 | Okami |
| 5,762,830 A | * | 6/1998 | Long et al. .................. 252/512 |
| 6,414,078 B1 | * | 7/2002 | Fukushima et al. ......... 524/588 |
| 2001/0021730 A1 | | 9/2001 | Kaneyoshi |

FOREIGN PATENT DOCUMENTS

| | | |
|---|---|---|
| EP | 0 430 255 A2 | 6/1991 |
| EP | 647682 | 12/1995 |
| EP | 0 839 870 A2 | 5/1998 |
| EP | 1 090 959 A1 | 4/2001 |
| JP | 02255787 A * | 10/1990 |

* cited by examiner

Primary Examiner—Mark Kopec
(74) Attorney, Agent, or Firm—Birch, Stewart, Kolasch & Birch, LLP

(57) ABSTRACT

A conductive composition is obtained by dispersing conductive particles in a curable polymer. At least 50% by weight of the entire conductive particles are those conductive particles coated with a metal on their outermost layer surface and having a specific gravity which differs within ±1.5 from the specific gravity of the curable polymer. The composition remains stable during storage, experiences a minimal change with time of curability, and cures into a conductive rubber which experiences a minimal change with time of volume resistivity.

15 Claims, No Drawings

CONDUCTIVE COMPOSITION

This invention relates to conductive rubber compositions, and more particularly, to conductive rubber compositions which have improved storage stability, experience minimal changes with time of curability, and cure into conductive rubber experiencing minimal changes with time of volume resistivity. The term "conductive" used herein refers to electrical conduction throughout the specification.

BACKGROUND OF THE INVENTION

Conductive silicone rubber compositions cure into silicone rubber parts having excellent conductivity and are utilized in special applications where heat resistance, flexing resistance and conductivity are required at the same time. A typical conductive silicone rubber composition is disclosed in U.S. Pat. No. 5,173,765 as comprising an organopolysiloxane having at least two alkenyl groups per molecule, an organohydrogenpolysiloxane having at least two silicon-bonded hydrogen atoms per molecule, a platinum catalyst, and silver powder.

The silver powders used in such conductive silicone rubber are generally divided into three types, a reduced silver powder obtained by reducing an aqueous solution of silver nitrate with a reducing agent such as hydrazine, formaldehyde or ascorbic acid, an electrolytic silver powder obtained by subjecting an aqueous solution of silver nitrate to electrolysis for silver to precipitate on the cathode, and an atomized silver powder obtained by heating silver at 1,000° C. or higher and atomizing the molten silver into water or inert gas. With respect to their shape, these powders take the form of granular, flake, dendrite and irregular particles. Of these, flake silver powder is advantageously used because silicone rubber articles formed are highly conductive.

Recently, attempts have been made to blend silver powders which have been surface treated with organosilicon compounds or fluorinated polyether, for improving the storage stability of silicone rubber compositions and reducing the change with time of curability and volume resistivity.

However, when flake silver powder is blended in the conductive silicone rubber composition disclosed in U.S. Pat. No. 5,173,765, a problem arises during shelf storage that silver particles undergo phase separation from the composition. Also, the composition becomes less curable with the passage of time and reaches a point where it is uncurable. Besides, the conductive silicone rubber obtained by curing the composition experiences a considerable change of volume resistivity with time, and is thus unsuitable for everlasting electrical connection between conductors.

The surface treatment of silver powder with silicone compounds (see EP 647682) is effective for improving the affinity of silver powder to silicone rubber compositions, but insufficient to suppress any change of volume resistivity by thermal hysteresis.

SUMMARY OF THE INVENTION

An object of the present invention is to provide conductive rubber compositions which have improved storage stability, experience minimal changes with time of curability, and cure into conductive rubber experiencing minimal changes with time of volume resistivity.

It has been found effective to blend a curable polymer with conductive particles containing at least 50% by weight of conductive particles having a specific gravity which differs within ±1.5 from the specific gravity of the curable polymer and coated with a metal such as gold, silver or nickel on their outermost layer surface.

Among prior art liquid materials filled with metal powder for developing conductivity, those filled with silver particles are most commonly used. In the known technology, silver particles may have any desired shape, for example, granular, spherical, dendrite, flake and irregular shapes, and mixtures thereof. It is known that silver particles of dendrite or flake shape are chosen for developing satisfactory conductivity, and better conductivity is developed using silver particles of flake shape. It is also known to treat such metal particles with an organosiloxane or fluorine compound for preventing the particles from separating from the matrix resin.

Even when these techniques were used, it was difficult to avoid separation of conductive particles from the matrix resin during a long period of storage. Partial changes of conductivity during storage were observed. It was also ascertained that conductive elastomers after curing changed their conductivity by thermal shocks.

With these borne in mind, the inventor studied the nature of conductive particles. And the inventor has succeeded in minimizing the separation of conductive particles and the change of volume resistivity by thermal shocks, by controlling the specific gravity of conductive particles so that the difference between the specific gravity of conductive particles and the specific gravity of the matrix resin falls within ±1.5.

According the invention, there is provided a liquid conductive composition comprising (a) a curable polymer and (b) conductive particles in which those conductive particles coated with a metal on their outermost layer surface and having a specific gravity which differs within ±1.5 from the specific gravity of the curable polymer (a) account for at least 50% by weight of the entire conductive particles (b).

DESCRIPTION OF THE PREFERRED EMBODIMENTS

The liquid conductive composition of the present invention is defined as comprising (a) a curable polymer and (b) conductive particles.

The curable polymer (a) used herein may be either a polymer which cures by itself by heat or the like or a polymer which cures with the aid of a curing agent or catalyst. Included are polymers based on organopolysiloxane, perfluoropolyether, polyisobutylene, polyoxyalkylene, epoxy resins, and acrylic resins. Liquid polymers are preferred. From the standpoints of flexibility and heat resistance, organopolysiloxane and perfluoropolyether polymers are useful. The organopolysiloxane polymers include both addition reaction type (cure through hydrosilylation) and condensation cure type. Of the condensation cure type organopolysiloxane polymers, alcohol- and acetone-removal types are preferred for the purpose of the present invention. The addition cure type is also desirable. In the case of perfluoropolyether polymers, addition cure type polymers modified with silicon reactive groups are advantageously used.

Various compositions using addition cure type organopolysiloxane as component (a) are contemplated. Of these, a conductive silicone rubber composition comprising components (A), (B) and (C) is generally preferred.

(A) an organopolysiloxane having at least two alkenyl groups per molecule as the curable polymer (B) an organohyogenpolyslxane having at least two silicon-bonded hydrogen atoms (SiH groups) per molecule (C) a platinum group metal catalyst in a sufficient amount to help the composition cure Component (A) is a base polymer of the composition according to the first embodiment. It is an organopolysiloxane having at least two alkenyl groups per molecule. Exemplary alkenyl groups are those having 2 to 10 carbon atoms including vinyl, allyl, butenyl, pentenyl, hexenyl and heptenyl, with vinyl being preferred. The alkenyl groups may be bonded to the molecular chain at any desired position, for example, at ends and/or side chains of the molecular chain. In addition to the alkenyl groups, the organopolysiloxane has organic groups bonded to silicon atoms. Such organic groups are not critical, and include monovalent hydrocarbon groups having 1 to 10 carbon atoms, for example, alkyl groups such as methyl, ethyl, propyl, butyl, pentyl and hexyl; aryl groups such as phenyl, tolyl and xylyl; aralkyl groups such as benzyl and phenethyl; and halo-substituted alkyl groups such as 3-chloropropyl and 3,3,3-trifluoropropyl; with methyl and phenyl being preferred. The molecular structure of the organopolysiloxane is not critical and may be a linear, partially branched linear, branched, and network structure. Linear and partially branched linear structures are preferred. The organopolysiloxane should preferably have a viscosity of about 50 to 500,000 centipoise at 25° C., and more preferably about 400 to 10,000 centipoise at 25° C., although the viscosity is not limited thereto.

Illustrative, non-limiting examples of the organopolysiloxane (A) include molecular chain both end trimethylsiloxy-blocked dimethylsiloxane-methylvinylsiloxane copolymers, both end trimethylsiloxy-blocked methylvinylpolysiloxane, both end trimethylsiloxy-blocked methylvinylsiloxane-methylphenylsiloxane copolymers, both end trimethylsiloxy-blocked dimethylsiloxane-methylvinylsiloxane-methylphenylsiloxane copolymers, both end dimethylvinyisiloxy-biocked dimethylpolysiloxane, both end dimethylvinylsiloxy-blocked methylvinylpolysiloxane, both end dimethylvinylsiloxy-blocked methylphenylpolysiloxane, both end dimethylvinylsiloxy-blocked dimethylsiloxane-methylvinylsiloxane copolymers, both end dimethylvinylsiloxy-blocked dimethylsiloxane-methylphenylsiloxane copolymers, both end silanol-blocked dimethylsiloxane-methylvinylsiloxane copolymers, both end silanol-blocked methylvinylpolysiloxane, both end silanol-blocked dimethylsiloxane-methylvinylsiloxane-methylphenylsiloxane copolymers, silicone resins composed of $R_3SiO_{1/2}$ units and $SiO_{4/2}$ units, silicone resins composed of $RSiO_{3/2}$ units, silicone resins composed of $R_2SiO_{2/2}$ units, and $RSiO_{3/2}$ units. silicone resins composed of $R_2SiO_{2/2}$ units, $RSiO_{3/2}$ units and $SiO_{4/2}$ units, and mixtures of two or more. In the formulae representative of the units of the silicone resins, R is a substituted or unsubstituted monovalent hydrocarbon group having 1 to 10 carbon atoms. R should be selected such that each silicone resin has at least two alkenyl groups per molecule. Illustrative examples of R in the silicone resin units include alkyl groups such as methyl, ethyl, propyl, butyl, pentyl and octyl, alkenyl groups such as vinyl, allyl, butenyl, pentenyl and hexenyl, aryl groups such as phenyl, tolyl and xylyl, aralkyl groups such as benzyl and phenethyl, and halo-substituted alkyl groups such as 3-chloropropyl and 3,3,3-trifluoropropyl.

The organopolysiloxane (A) should preferably have a specific gravity in the range of about 0.97 to 1.4 at 25° C. although the specific gravity varies with substituent groups.

The organohydrogenpolysiloxane (B) serves as a curing agent for curing the composition of the first embodiment and should have at least two silicon-bonded hydrogen atoms (SiH groups) per molecule. The hydrogen atoms may be bonded to silicon atoms in the molecular chain at any desired position, for example, at ends and/or side chains of the molecular chain. The organohydrogenpolysiloxane further has organic groups bonded to silicon atoms. Such organic groups are not critical, and include monovalent hydrocarbon groups having 1 to 10 carbon atoms, for example, alkyl groups such as methyl, ethyl, propyl, butyl, pentyl and hexyl; aryl groups such as phenyl, tolyl and xylyl; aralkyl groups such as benzyl and phenethyl; and halo-substituted alkyl groups such as 3-chloropropyl and 3,3,3-trifluoropropyl; with methyl and phenyl being preferred. The molecular structure of the organohydrogenpolysiloxane is not critical and may be a linear, partially branched linear, branched, and network structure. Linear and partially branched linear structures are preferred. The organohydrogenpolysiloxane should preferably have a viscosity of about 1 to 50,000 centipoise at 25° C., and more preferably about 5 to 1,000 centipoise at 25° C., although the viscosity is not limited thereto.

Illustrative, non-limiting examples of the organohydrogenpolysiloxane (B) include molecular chain both end trimethylsiloxy-blocked methylhydrogenpolysiloxane, both end trimethylsiloxy-blocked dimethylsiloxane-methylhydrogensiloxane copolymers, both end trimethylsiloxy-blocked methylhydrogensiloxane-methylphenylsiloxane copolymers, both end trimethylsiloxy-blocked dimethylsiloxane-methylhydrogensiloxane-methylphenylsiloxane copolymers, both end dimethylhydrogensiloxy-blocked dimethylpolysiloxane, both end dimethylhydrogensiloxy-blocked methylhydrogenpolysiloxane, both end dimethylhydrogensiloxy-blocked dimethylsiloxane-methylhydrogensiloxane copolymers, both end dimethylhydrogensiloxy-blocked dimethylsiloxane-methylphenylsiloxane copolymers, both end dimethylhydrogensiloxy-blocked methylphenylpolysiloxane, both end silanol-blocked methylhydrogenpolysiloxane, both end silanol-blocked dimethylsiloxane-methylhydrogensiloxane copolymers, both end silanol-blocked methylhydrogensiloxane-methylphenylsiloxane copolymers, and both end silanol-blocked dimethylsiloxane-methylhydrogensiloxane-methylphenylsiloxane copolymers.

Component (B) is blended in such amounts that 0.5 to 10 silicon-bonded hydrogen atoms in component (B) are available per alkenyl group in component (A). If component (B) is blended in such amounts that less than 0.5 silicon-bonded hydrogen atoms in component (B) are available per alkenyl group in component (A), the resulting composition may become under-cured. If component (B) is blended in such amounts that more than 10 silicon-bonded hydrogen atoms in component (B) are available per alkenyl group in component (A), the resulting composition may cure into conductive silicone rubber which is less heat resistant.

The platinum group metal catalyst (C) serves to promote curing of the composition of the first embodiment. To this end, compounds commonly known as hydrosilylation reaction catalysts are useful. Illustrative examples of the catalyst (C) include platinum black, platinum-carrying alumina powder, platinum-carrying silica powder, platinum-carrying carbon powder, chloroplatinic acid, alcohol solutions of chloroplatinic acid, complexes of chloroplatinic acid with olefins, and complexes of chloroplatinic acid with vinylsiloxanes. Also useful are dispersions of the foregoing platinum group metal catalysts in thermoplastic organic resins such as methyl methacrylate resins, polycarbonate resins, polystyrene resins, and silicone resins, that is, microparticulate platinum group metal catalysts.

In the composition of the first embodiment, the amount of the catalyst (C) is not critical and may be a catalytic amount sufficient to help the composition cure. For example, the catalyst (C) is blended in such amounts as to give about 1 to 1,000 ppm of platinum metal based on the weight of components (A) and (B) combined.

Also, various liquid compositions using addition cure type perfluoropolyether polymer as component (a) are contemplated. Of these, a conductive fluoro-resin composition comprising components (A'), (B') and (C) is generally preferred.

(A') a reactive fluorinated polyether polymer comprising fluorinated polyether units and having at least two aliphatic unsaturated hydrocarbon groups per molecule as the curable polymer (B') a compound having at least two silicon-bonded hydrogen atoms (SiH groups) per molecule (C) a platinum group metal catalyst in a sufficient amount to help the composition cure Component (A') is a base polymer of the composition according to the second embodiment. It is a reactive flourinated polyether polymer comprising flourinated polyether units and having at least two aliphatic unsaturated hydrocarbon groups per molecule.

The fluorinated polyether units in the reactive fluorinated polyether polymer (A') are preferably units of the general formula (1):

$$—(Rf—O)_q— \quad (1)$$

wherein Rf is a straight or branched perfluoroalkylene group having 1 to 6 carbon atoms and q is an integer of 1 to 500.

In formula (1), Rf is a straight or branched perfluoroalkylene group having 1 to 6 carbon atoms and preferably 1 to 3 carbon atoms. Illustrative examples of —Rf—O— groups include —$CF_2O$—, —$CF_2$—$CF_2$—O—, —$CF_2$—$CF_2$—$CF_2O$—, —$CF_2$—$CF_2$—$CF_2$—$CF_2$—O—, —$CF_2$—$CF_2$—$CF_2$—$CF_2$—$CF_2$—O—, —$CF(CF_3)$—$CF_2$—O—, and —$CF(CF_3)_2$—O—, alone or mixtures of two or more thereof. The letter q is an integer of 1 to 500, preferably 2 to 400, and more preferably 10 to 200.

Suitable aliphatic unsaturated hydrocarbon groups are alkenyl groups having 2 to 8 carbon atoms, for example, vinyl, allyl, propenyl, isopropenyl, butenyl, hexenyl, cyclohexenyl. Those groups having a $CH_2$=$CH$— structure at an end are preferred, with vinyl and allyl being especially preferred.

The reactive fluorinated polyether polymer (A') should have at least two aliphatic unsaturated hydrocarbon groups per molecule while the aliphatic unsaturated hydrocarbon group may be bonded to the backbone at its end directly or through another atom, or at an intermediate position of the molecule. From the standpoints of curing effects and cured properties, it is preferred for the polymer to have aliphatic unsaturated hydrocarbon groups directly or indirectly bonded to a backbone of straight or branched fluoropolyether at opposite ends.

Typical examples of the reactive fluorinated polyether polymer are compounds of the general formula (2):

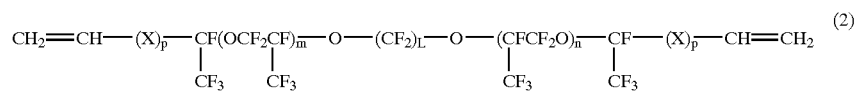

Herein, X is independently —$CH_2$—, —$CH_2O$— or —Y—NR—CO— wherein Y is —$CH_2$— or a group of the following structural formula:

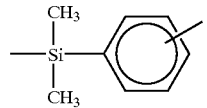

(the bond may be at o-, m- or p-position) and R is hydrogen, methyl, phenyl or allyl, p is independently 0 or 1, L is an integer of 2 to 6, m and n each are an integer of 0 to 200, and preferably 5 to 100.

The reactive fluorinated polyether polymer of formula (2) should preferably have a number average molecular weight of about 400 to 100,000 and preferably about 1,000 to 50,000. The compound of formula (2) is a generally linear polymer (in which the recurring units —Rf—O— may be either straight or branched) although it is acceptable that the reactive fluorinated polyether polymer (A') be a branched one.

Illustrative, non-limiting examples of the reactive fluorinated polyether polymer having formula (2) are given below:

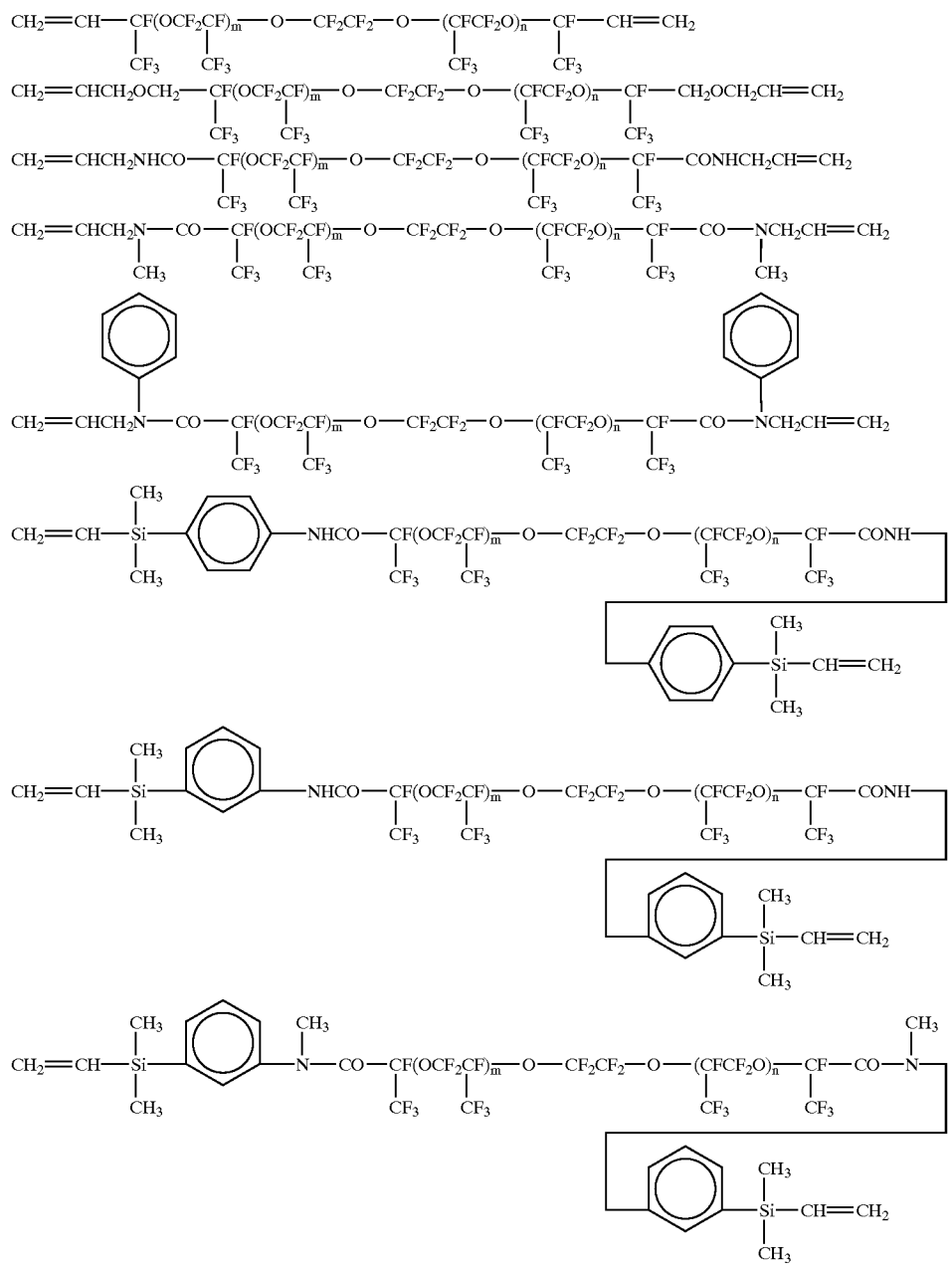

Herein each of m and n is an integer of 0 to 200, and preferably 10 to 200.

In order to previously adjust a linear fluoropolyether compound to an appropriate molecular weight for a particular purpose, addition reaction through hydrosilylation may be effected between a linear fluorinated polyether polymer having an alkenyl group only at either end of the molecular chain as mentioned above and an organosilicon compound such as an organopolysiloxane having two SiH groups within the molecule (often at either end of the molecular chain). The thus chain-lengthened product (typically a fluorinated polyether-siloxane block copolymer having a fluorinated polyether moiety at either end) can be used as component (A').

The reactive fluorinated polyether polymer (A') should preferably have a specific gravity in the range of about 1.6 to 1.8 at 25° C.

Component (B') is a compound having at least two, preferably at least three hydrogen atoms each directly attached to a silicon atom (SiH groups) per molecule. Component (B') serves as a crosslinking agent. Any desired compound may be used as long as it has SiH groups capable of undergoing hydrosilylation reaction with aliphatic unsaturated hydrocarbon groups in component (A') in the presence of the platinum group metal catalyst (C). Suitable compounds include organohydrogenpolysiloxane having an unsubstituted or fluoro-substituted monovalent hydrocarbon group or perfluoropolyether-containing hydrocarbon group as a monovalent substituent (organo group) on a silicon atom, hydrosilyl group-containing perfluoro hydrocarbon compounds, and hydrosilyl group-containing perfluoropolyether compounds. Most often, use of organohydrogenpolysiloxane employed in the reaction of organopolysiloxane is convenient. With the compatibility with component (A') taken into account, when the monovalent substituent (organo group) on a silicon atom is an unsubstituted monovalent hydrocarbon group free of a fluoro-substituted hydrocarbon group, low molecular weight organohydrogenpolysiloxanes having 2 to 10 silicon atoms, especially about 3 to 5 silicon atoms, and cyclic organohydrogenpolycyclosiloxanes are especially preferred.

Suitable unsubstituted monovalent hydrocarbon groups include hydrocarbon groups of 1 to about 12 carbon atoms, preferably aliphatic unsaturation-free hydrocarbon groups of 1 to about 8 carbon atoms, for example, alkyl groups such as methyl, ethyl, propyl, isopropyl, butyl, isobutyl, tert-butyl, hexyl, cyclohexyl, and octyl; alkenyl groups such as vinyl, allyl, propenyl and butenyl; aryl groups such as phenyl tolyl, xylyl and naphthyl, and aralkyl groups such as phenylethyl and phenylpropyl. Suitable fluoro-substituted monovalent hydrocarbon groups or perfluoropolyether-containing hydrocarbon groups include perfluoroalkyl groups of 1 to 12 carbon atoms, and monovalent groups of the following formulae:

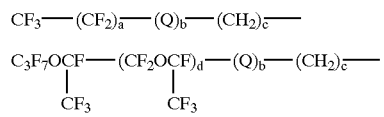

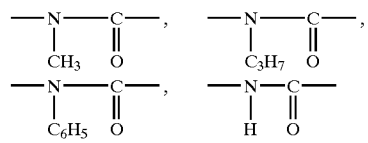

Note that a is an integer of 0 to 9, b is 0 or 1, c is 2 or 3, d is an integer of 0 to 5, and Q is selected from the following groups.

$$\begin{array}{cc} -\underset{\underset{CH_3}{|}}{N}-\underset{\underset{O}{\|}}{C}-, & -\underset{\underset{C_3H_7}{|}}{N}-\underset{\underset{O}{\|}}{C}-, \\ -\underset{\underset{C_6H_5}{|}}{N}-\underset{\underset{O}{\|}}{C}-, & -\underset{\underset{H}{|}}{N}-\underset{\underset{O}{\|}}{C}- \end{array}$$

Where high molecular weight siloxanes are used, they are desirably modified with fluorine compounds to improve the compatibility thereof with component (A'). Compounds having SiH groups at ends and elsewhere on a perfluoropolyether or perfluoropolyalkylene backbone may also be used as the preferred SiH source.

Illustrative, non-limiting examples of the compound (B') are given below. Note that Me is methyl and Ph is phenyl.

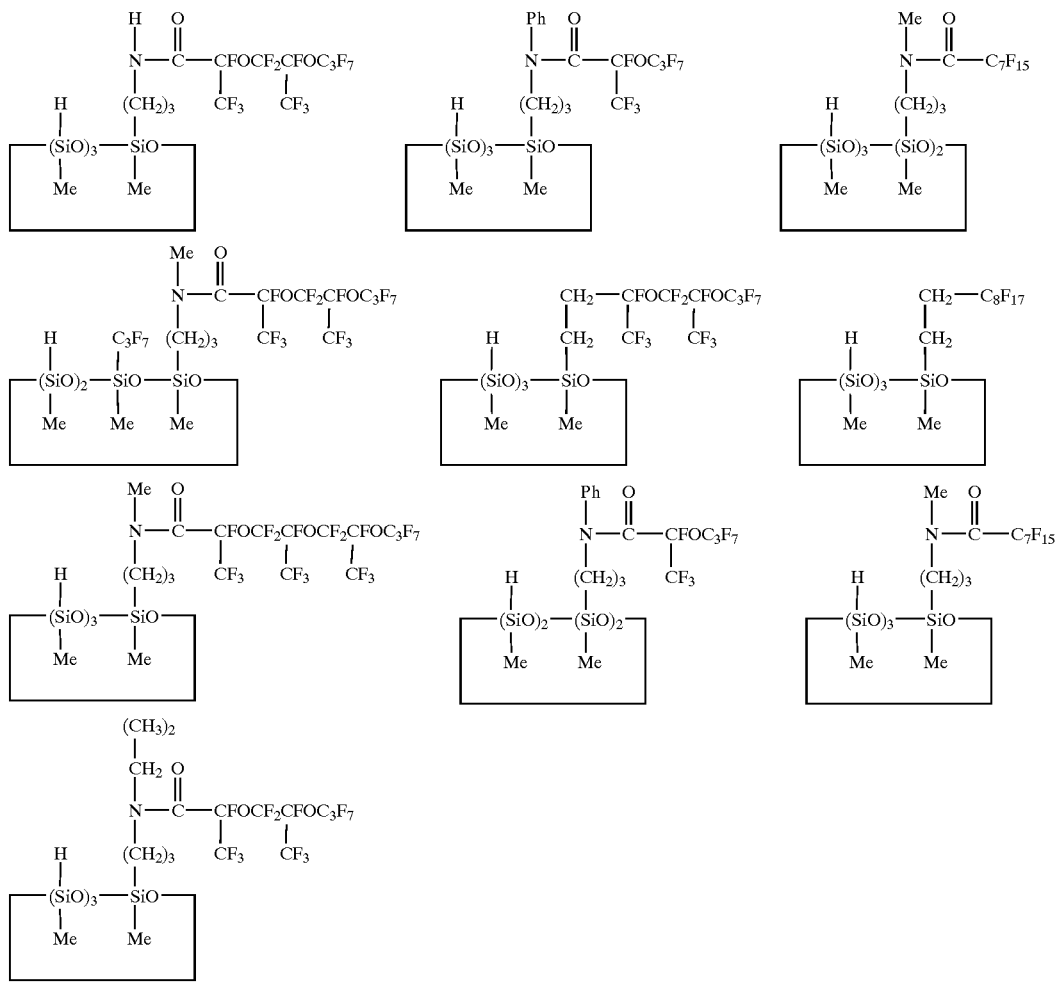

-continued

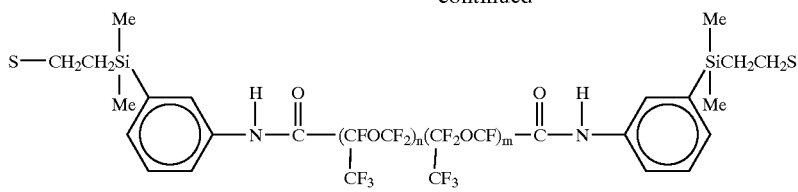

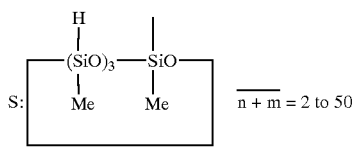

$\overline{n+m} = 2 \text{ to } 50$

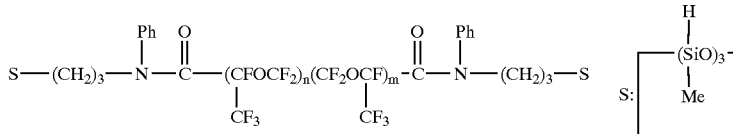

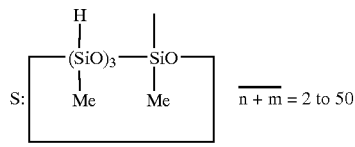

$\overline{n+m} = 2 \text{ to } 50$

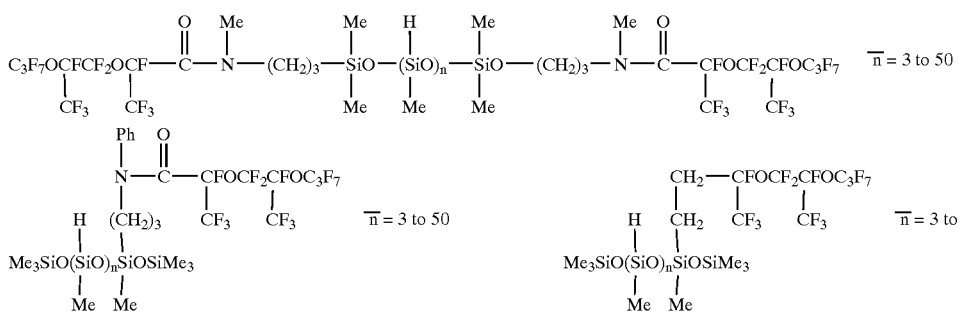

Component (B') is blended in such amounts that the quantity of silicon-bonded hydrogen atoms (i.e., SiH groups) in component (B') relative to aliphatic unsaturated hydrocarbon groups in component (A') is 0.5 to 10 equivalents (mol/mol), and preferably 0.8 to 5 equivalents (mol/mol).

As the platinum group metal catalyst (C), platinum group transition metals and compounds thereof customarily used in hydrosilylation addition reaction are useful. Examples are the same as described above in conjunction with the organopolysiloxane in the first embodiment.

The composition containing the curable polymer (a) is obtained, for example, by intimately mixing components (A), (B) and (C) or components (A'), (B') and (C). It is preferred to further blend therein an organosilicon compound having a silicon-bonded alkoxy group as (D) an optional component for restraining any change with time of the contact resistance and volume resistivity of conductive rubber.

Illustrative of the organosilicon compound (D) are alkoxysilanes including tetramethoxysilane, tetraethoxy-silane, dimethyldimethoxysilane, methylphenyldimethoxy-silane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane. The organosilicon compounds shown below are also useful because conductive rubber compositions having improved adhesion can be prepared using them.

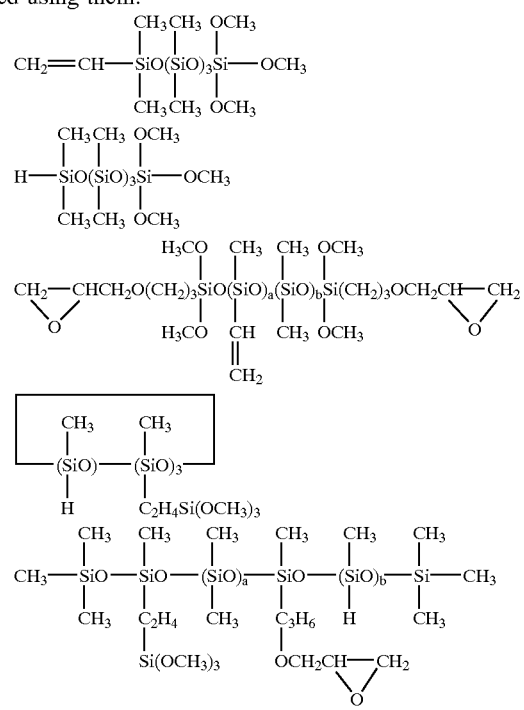

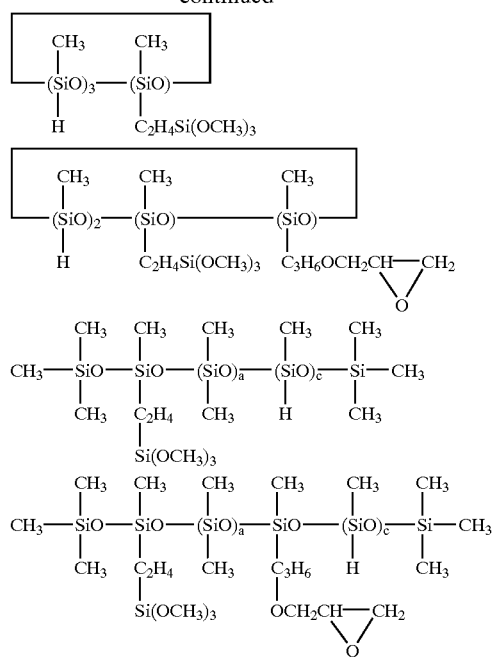

Note that each of a, b and c is an integer of at least 1.

In the compositions of the first and second embodiments, the blending of component (D) is optional. The amount of component (D), if used, is preferably up to 20 parts by weight and more preferably 0.5 to 8 parts by weight, per 100 parts by weight of component (A) or (A').

In the present invention, the conductive rubber composition may further include an optional component for improving the storage stability and ease of handling or operation of the composition. Cure inhibitors are useful to this end including alkyn alcohols such as 3-methyl-1-butyn-3-ol, 3,5-dimethyl-1-hexyn-3-ol and phenylbutynol; enyne compounds such as 3-methyl-3-penten-1-yne and 3,5-dimethyl-3-hexen-1-yne; and 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. An appropriate amount of the cure inhibitor is 0.001 to 5 parts by weight per 100 parts by weight of component (A) or (A'). The composition containing the curable polymer (a) may further include an inorganic filler as an optional component for imparting an appropriate hardness and strength to conductive rubber after curing. Examples of the inorganic filler which can be included in the composition include fumed silica, crystalline silica, fired silica, wet silica, fumed titanium oxide, carbon black, and the foregoing inorganic fillers surface treated with organosilicon compounds such as organoalkoxysilanes, organochlorosilanes and organodisilazanes. An appropriate amount of the inorganic filler is up to 50 parts by weight per 100 parts by weight of component (A) or (A').

In the compositions of the first and second embodiments, conventional components may be included in addition to the essential and optional components mentioned above. These compositions do not contain conductive particles and conductive materials.

Reference is now made to the conductive particles as component (b). The conductive particles (b) are characterized in that those conductive particles coated with a metal such as gold, silver or nickel on their outermost layer surface and having a specific gravity which differs within ±1.5 from the specific gravity of the curable polymer (a) account for at least 50% by weight of the entire conductive particles (b).

Such low specific gravity conductive particles are preferably low specific gravity particles, typically hollow or foamed particles, which are coated with a metal such as gold, silver or nickel on their outermost layer. Specifically the low specific gravity particles are plated with the metal. The low specific gravity particles serving as cores are preferably hollow particles.

Hollow particles serving as cores may be either hollow inorganic particles or hollow organic particles having heat resistance. Hollow glass particles are commercially available under the trade name of Cel-star (Tokai Industry Co., Ltd.), Scotchlite (3M Co.), and Hollow Glass Beads (Potters Ballotini Co., Ltd.). Hollow aluminosilicate particles are commercially available under the trade name of E-Spheres (Chichibu-Onoda Co., Ltd.), Fillite (Nippon Fillite Co., Ltd.), and Silas Balloon (Marunakahakudo Co., Ltd.). Heat resistant hollow organic particles are commercially available under the trade name of Phenoset (Tomoe Industry Co., Ltd., made of phenolic resin).

The low specific gravity particles preferably have an average particle size of 0.01 to 1,000 µm, and more preferably 0 1 to 100 µm. Particles with a size of less than 0.01 micron have so large a specific surface area that more metal may be plated thereon, leading to an increased cost. Particles with a size of more than 1,000 microns may be difficult to mix with the matrix material, and cured products filled with such large particles may have irregular surfaces.

The low specific gravity particles should preferably have a specific gravity of 0.01 to 3.0 and more preferably 0.1 to 2.5. With a specific gravity of less than 0.01, particles have so thin walls and they may be vulnerable to mechanical failure. If core particles have a specific gravity of more than 3.0, such particles coated with a metal (i.e., conductive particles) may have a specific gravity which is higher than the specific gravity of the polymer (a) by at least 1.5, and when blended in a polymer composition, they may often settle down and separate from the composition with the passage of time.

Conductive particles are generally obtained by conducting electroless plating on the core particles for covering the core particle surface with a metal layer. When the outermost layer of particles is gold or silver, the particles are often pretreated with nickel as a subbing layer. The conductive particles can be obtained by conventional electroless plating. For increasing the bond force between core particles and the metal layer, the core particles are treated with a silicon polymer having a reducing power to form a layer of reducing silicon polymer on the outermost surface of core particles. Preferred examples of the reducing silicon polymer include polysilanes, polycarbosilanes, polysiloxanes and polysilazanes having Si—Si bonds and/or Si—H bonds. Of these, polysilanes and/or polysiloxanes having hydrogen atoms directly attached to silicon atoms are especially preferred.

Especially preferred are polysilanes of the formula (3):

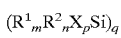

wherein $R^1$ and $R^2$ each are hydrogen or a substituted or unsubstituted monovalent hydrocarbon group, X is $R^1$, an alkoxy group, halogen atom, oxygen atom or nitrogen atom, m, n and p are numbers in the range: $0.1 \leq m \leq 2$, $0 \leq n \leq 1$, $0 \leq p \leq 0.5$ and $1 \leq m+n+p \leq 2.5$, and q is an integer of 4 to 100,000.

In formula (3), $R^1$ and $R^2$ are selected from hydrogen and monovalent hydrocarbon groups. When the hydrocarbon groups are aliphatic or alicyclic, those groups of 1 to 12 carbon atoms, preferably 1 to 6 carbon atoms, are preferred, for example, methyl, ethyl propyl, butyl, pentyl, hexyl, cyclopentyl and cyclohexyl. When the monovalent hydrocarbon groups are aromatic, those groups of 6 to 14 carbon atoms, preferably 6 to 10 carbon atoms, are preferred, for example, phenyl, tolyl, xylyl, naphthyl and benzyl. Also included are substituted hydrocarbon groups in which some or all of the hydrogen atoms on the foregoing unsubstituted hydrocarbon groups are replaced by halogen atoms, alkoxy groups, amino groups, aminoalkyl groups or the like, for example, monofluoromethyl, trifluoromethyl and m-dimethylaminophenyl groups. X is selected from among the same groups as defined for $R^1$, alkoxy groups, and halogen atoms. Suitable alkoxy groups are those of 1 to 4 carbon atoms such as methoxy, ethoxy and isopropoxy. Suitable halogen atoms are fluorine, chlorine and bromine. Most often methoxy and ethoxy are preferred. The subscripts m, n and p are numbers in the range: $0.1 \leq m \leq 2$, especially $0.5 \leq m \leq 1$, $0 \leq n \leq 1$, especially $0.5 \leq n \leq 1$, $0 \leq p \leq 0.5$, especially $0 \leq p \leq 0.2$, and $1 \leq m+n+p \leq 2.5$, especially $1.5 \leq m+n+p \leq 5$ 2, and q is an integer of from 4 to 100,000, especially from 10 to 10,000.

Also preferred are polysiloxanes of the formula (4):

$$(R^3{}_a R^4{}_b H_c SiO_d)_e \qquad (4)$$

wherein $R^3$ and $R^4$ each are hydrogen, a substituted or unsubstituted monovalent hydrocarbon group, alkoxy group or halogen atom, a, b, c and d are numbers in the range: $0.1 \leq a \leq 2$, $0 \leq b \leq 1$, $0.01 \leq c \leq 1$, $0.5 \leq d \leq 1.95$, and $2 \leq a+b+c+d \leq 3.5$, and e is an integer of 2 to 100,000.

In formula (4), $R^3$ and $R^4$ are selected from hydrogen and monovalent hydrocarbon groups. When the monovalent hydrocarbon groups are aliphatic or alicyclic, those groups of 1 to 12 carbon atoms, preferably 1 to 6 carbon atoms, are preferred, for example, methyl, ethyl, propyl, butyl, pentyl, hexyl, cyclopentyl and cyclohexyl. When the monovalent hydrocarbon groups are aromatic, those groups of 6 to 14 carbon atoms, preferably 6 to 10 carbon atoms, are preferred, for example, phenyl, tolyl, xylyl, naphthyl and benzyl. Also included are substituted hydrocarbon groups in which some or all of the hydrogen atoms on the foregoing unsubstituted hydrocarbon groups are replaced by halogen atoms, alkoxy groups, amino groups, aminoalkyl groups or the like, for example, monofluoromethyl, trifluoromethyl and m-dimethylaminophenyl groups. $R^3$ and $R^4$ may also be alkoxy groups or halogen atoms. Suitable alkoxy groups are those of 1 to 4 carbon atoms such as methoxy, ethoxy and isopropoxy. Suitable halogen atoms are fluorine, chlorine and bromine. Most often methoxy and ethoxy are preferred. The subscripts a, b, c and d are numbers in the range: $0.1 \leq a \leq 2$, preferably $0.5 \leq s \leq 1$, $0 \leq b \leq 1$, preferably $0.5 \leq b \leq 1$, $0.01 \leq c \leq 1$, preferably $0.1 \leq c \leq 1$, $0.5 \leq d \leq 1.95$, preferably $1 \leq d \leq 1.5$, and $2 \leq a+b+c+d \leq 3.5$, preferably $2 \leq a+b+c+d \leq 3.2$, and e is an integer of from 2 to 100,000, preferably from 10 to 10,000.

In the practice of the invention, the conductive particles are prepared by a process involving the steps of (1) treating core particles with a reducing silicon polymer to form a layer of reducing silicon polymer on surfaces of core particles, (2) dispersing the treated particles in a non-agglomerated state in water, and treating the particles with a salt of a metal having a standard oxidation-reduction potential of 0.54 volt or higher to deposit metal colloid on the reducing silicon polymer layer, and (3) immersing the particles in an electroless plating solution and allowing a metal layer to deposit on the outermost surfaces of the particles.

Finally, the resulting particles are heat treated at a temperature of at least 200° C. whereby the reducing silicon polymer is partially or entirely converted into ceramic.

In the first step, the reducing silicon polymer is dissolved in an organic solvent. The hollow particles are admitted into the solution or vice versa. After mixing, the organic solvent is removed whereby a reducing silicon polymer layer is formed on the particle surface.

The organic solvents in which the reducing silicon polymer is dissolved include aromatic hydrocarbon solvents such as benzene, toluene and xylene, aliphatic hydrocarbon solvents such as hexane, octane and cyclohexane, ether solvents such as tetrahydrofuran and dibutyl ether, esters such as ethyl acetate, dipolar aprotic solvents such as dimethylformamide, dimethyl sulfoxide and hexamethyl phosphoric triamide, nitromethane and acetonitrile.

The solution preferably has a concentration of 0.01 to 30% by weight, more preferably 1 to 10% by weight of the reducing silicon polymer. With a too low concentration, it may become difficult for a satisfactory silicon polymer layer to form on the particle surface. A concentration of more than 30% may cause a larger amount of the reducing silicon polymer to be used, inviting an increased cost.

At the end of treatment, the solvent is distilled off by raising the temperature or evacuating to vacuum. It is often effective to dry the treated particles by agitating them above the boiling point of the solvent, for example, at a temperature of about 40 to 200° C. under a vacuum of 1 to 100 mmHg. Thereafter, the treated particles are held for a while in a dry atmosphere or vacuum at a temperature of about 40 to 200° C. During the period, the solvent is effectively distilled off and the treated particles are dried. In this way, a reducing silicon polymer-coated hollow particle powder is obtained.

The reducing silicon polymer layer generally has a thickness of 0.001 to 1.0 μm, desirably 0.01 to 0.1 μm. With a thickness of less than 0.001 μm, it may leave some particle surface areas uncovered where plating will not take place later. A thickness of more than 1.0 μm may lead to an increased amount of reducing silicon polymer, which is economically disadvantageous.

By treatment with the reducing silicon polymer, the powder particles are rendered hydrophobic. As a consequence, the treated particles have a low affinity to the solvent in which the metal salt is dissolved, and are sometimes not effectively dispersed in the solution, precluding efficient metal salt-reducing reaction. Such a loss of efficiency of metal salt-reducing reaction can be compensated for by adding a surfactant. The surfactant used herein is desirably one capable of reducing only surface tension without foaming. Non-ionic surfactants such as Surfynol 104, 420 and 504 by Nisshin Chemical Industry Co., Ltd. are preferred.

In the second step, the powder particles having the reducing silicon polymer borne on their surfaces are treated with a solution containing a salt of a metal having a standard oxidation-reduction potential of at least 0.54 volt whereby metal colloid deposits on the reducing silicon polymer surface.

The metal salt from which the metal colloid is formed is a salt of a metal having a standard oxidation-reduction potential of at least 0.54 volt. Specifically salts of gold having a standard oxidation-reduction potential of 1.50 volts, palladium having a standard oxidation-reduction potential of 0.99 volt, and silver having a standard oxidation-reduction potential of 0.80 volt are preferably used. The gold salts are those of $Au^+$ and $Au^{3+}$, for example, $NaAuCl_2$, $NaAuCl_4$, $NaAu(CN)_2$, and $NaAu(CN)_4$. The palladium salts are those of $Pd^{2+}$ and are generally represented by Pd—$Z_2$ wherein Z is a halogen such as Cl, Br or I, acetate, trifluoroacetate, acetylacetonate, carbonate, perchlorate, nitrate, sulfate, or oxide. Examples are $PdCl_2$, $PdBr_2$, $PdI_2$, $Pd(OCOCH_3)_2$, $Pd(OCOCF_3)_2$, $PdSO_4$, $Pd(NO_3)_2$, and PdO. The silver salts are those which generate $Ag^+$ when dissolved in a solvent and are generally represented by Ag—Z wherein Z is borate, phosphate, perchlorate or sulfonate. Examples are $AgBF_4$, $AgClO_4$, $AgPF_6$, $AgBPh_4$, $Ag(CF_3SO_3)$, and $AgNO_3$.

As the technique of treating the powder particles with a solution of the metal salt, it is preferred to prepare a solution of the metal salt in a solvent which does not dissolve the reducing silicon polymer, but can dissolve or disperse the metal salt, and admit the silicon polymer-coated particles into the solution whereby the particles are contacted with the metal salt. With this treatment, the metal salt is adsorbed and simultaneously reduced on the surface of the silicon polymer layer covering powder particles, forming metal-coated powder particles on which the metal is borne in colloid form.

Examples of the solvent which does not dissolve the reducing silicon polymer, but can dissolve or disperse the metal salt include water, ketones such as acetone and methyl ethyl ketone, alcohols such as methanol and ethanol, and dipolar aprotic solvents such as dimethylformamide, dimethyl sulfoxide and hexamethyl phosphoric triamide, with water being especially preferred.

The concentration of the metal salt varies with the solvent in which the salt is dissolved and preferably ranges from 0.01% by weight to the salt saturated solution. A concentration of less than 0.01% may offer an insufficient amount of metal colloid serving as a catalyst for subsequent plating. Beyond the saturated solution, the solid salt will undesirably precipitate out. When the solvent is water, the concentration of the metal salt is preferably 0.01 to 20%, and more preferably 0.1 to 5% by weight. Typically, the silicon polymer-treated powder particles are immersed in a solution of the metal salt at room temperature to 70° C. for about 0.1 to 120 minutes, more preferably about 1 to 15 minutes. Then there is obtained a powder in which metal colloid has deposited on the surface of the silicon polymer layer.

According to the invention, the treatment with the metal salt solution is effected either in the presence or absence of a surfactant, desirably in the presence of a surfactant. More particularly, as a result of the reducing silicon polymer treatment, the particles are hydrophobic. The silicon polymer-coated particles sometimes have less affinity to the metal salt solution and are not readily dispersed therein, indicating that the reaction of forming metal colloid is inefficient. It is thus recommended to add a surfactant to improve the dispersion, ensuring that the reducing silicon polymer-coated powder particles are briefly dispersed in the metal salt solution.

The surfactant used herein may be any of anionic surfactants, cationic surfactants, ampholytic surfactants, and nonionic surfactants. The anionic surfactants include sulfonic salts, sulfuric ester salts, carboxylic salts, and phosphoric ester salts. The cationic surfactants include ammonium salts, alkylamine salts and pyridinium salts. The ampholytic surfactants include betaine, aminocarboxylic acid, and amine oxide surfactants. The nonionic surfactants include ether, ester and silicone surfactants.

The amount of the surfactant added is preferably such that the silicon polymer-coated particles may be uniformly dispersed in the metal salt solution containing a surfactant or a surfactant solution. Desirably 0.0001 to 10 parts, more desirably 0.001 to 1 part, and especially 0.01 to 0.5 part by weight of the surfactant is used per 100 parts by weight of the metal salt solution. Less amounts of the surfactant are less effective whereas excessive amounts of the surfactant may adversely affect the covering power of subsequent plating and cause discoloration of the plated metal.

As the treating technique involving the use of a surfactant, it is recommended that the silicon polymer-treated powder particles are first contacted with the surfactant alone or the surfactant diluted with water, dispersed by agitation, and then contacted with the metal salt solution. With this order, the reducing action of the silicon polymer promotes the reaction of forming the metal colloid on the silicon polymer layer surface. Where the surfactant is omitted, it is preferred that the silicon polymer-treated powder particles be contacted with the solvent and dispersed therein by thorough agitation.

After the above treatment, the treated particles are treated with a fresh solvent of the same type, but free of the metal salt for removing the unnecessary metal salt which has been merely adsorbed on the particles, but not reduced. Finally the unnecessary solvent is dried off from the particles, yielding a metal colloid-coated powder.

The third step is to effect electroless plating on the metal colloid-coated powder particles. The electroless plating solution used herein contains a solution of a metal salt to be plated and a reducing agent solution as the essential components, and a complexing gent, a pH adjusting agent and a surfactant as optional components.

The electroless plating solution used herein is a solution of a metal salt. The preferred metals to form the salts are metal materials containing, for example, nickel, copper, silver, cobalt, tungsten, iron, zinc, gold, platinum and palladium. These metals may be used alone or as alloys thereof, such as Ni—Co, Ni—W, Ni—Fe, Co—W, Co—Fe, Ni—Cu, Ni—P, Au—Pd, Au—Pt and Pd—Pt. When it is desired to form an alloy coating, a corresponding plurality of metal salts may be added. Nickel is especially preferred.

In addition to the metal salt(s), the electroless plating solution generally contains a reducing agent such as sodium hypophosphite, formalin, hydrazine or sodium boron hydride, a pH adjuster such as sodium acetate, and a complexing agent such as phenylenediamine or sodium potassium tartrate. The proportion of the plating metal salt solution and the reducing agent solution varies with a particular combination of these solutions and does not fall within a certain range. However, since the reducing agent is wastefully consumed through decomposition as by oxidation, the reducing agent is generally used in excess of the metal salt, and often in an amount of about 1.1 to 5 moles per mole of the metal salt.

Electroless plating solutions are commercially available at a reasonable cost.

The electroless nickel plating solution is described in detail. Generally, the electroless nickel plating solution contains a water-soluble nickel salt, complexing agent, pH adjuster, and phosphorus reducing agent.

The nickel salt used herein may be selected from well-known salts such as nickel sulfate, nickel chloride and nickel acetate. The nickel salt concentration maybe 0.01 to 0.5 mol/l, and preferably 0.05 to 0.3 mol/l of the entire plating bath. A too high nickel salt concentration has the drawbacks that a slight change of pH or a slight change of complexing agent concentration may cause formation of hydroxide to reduce the life of the bath and that replenishment tends to invite a local variation of the nickel salt concentration which in turn, causes formation of spots. A too low nickel salt concentration may require a greater amount of replenishment solution so that the volume of the bath largely changes during plating, which is impractical.

The complexing agent may be selected from well-known ones, for example, hydroxycarboxylic acids and salts thereof, phosphoric salts, ammonium salts, carboxylic acids and salts thereof, amines having amino and carboxyl groups and salts thereof. Of these complexing agents, the hydroxycarboxylic acid salts such as ammonium citrate and sodium tartrate, carboxylic acid salts such as sodium acetate, and amines having amino and carboxyl groups such as glycine are preferable, because they do not allow nickel hydroxide to form even when the pH of the plating bath changes and because they do not form with nickel a complex ion which is stable enough to prevent reductive deposition of nickel. The concentration of the complexing agent is closely correlated to the concentrations of the nickel salt and pH adjuster and usually in the range of 0.03 to 1.5 mol/l and preferably 0.15 to 0.2 mol/l of the entire plating bath. A larger amount of the complexing agent which is excessive relative to the nickel salt is wasteful. A smaller amount of the complexing agent may invite instability to a pH change and be less effective for restraining formation of nickel hydroxide.

As the pH adjuster, any of well-known, inexpensive, readily available agents may be used. Ammonium hydroxide (aqueous ammonia) and alkali hydroxides such as sodium hydroxide are preferably used because they do not largely alter the reduction of nickel complex ion by the phosphorus reducing agent relative to a pH change. The concentration of the pH adjuster may be determined in accordance with a change of pH of the plating bath during the process, treating time, and replenishment amount. Below pH 3, little plating reaction may occur and so, a longer time may be taken for plating. Beyond pH 10 may cause the instability of the nickel complex, frequent precipitation of nickel hydroxide and too rapid deposition reaction, which in turn, causes abnormal deposition of nickel and degradation of the plating solution. It is then recommended to adjust the bath at pH 3 to 10.

The phosphorus reducing agent used herein is selected from hypophosphorous acid and alkali metal and ammonium salts thereof, typically sodium hypophosphite. The concentration is desirably 1.01 to 5 mol, more desirably 1.5 to 3 mol of the reducing agent per mol of the nickel salt and 0.001 to 2.5 mol/l, more desirably 0.1 to 1 mol/l of the entire plating bath.

According to the invention, treatment with the electroless plating solution can be effected in the presence of a surfactant if necessary. In the preferred embodiment, the metal colloid-coated powder particles are pretreated with the surfactant prior to pouring into the electroless plating solution, or the surfactant is poured into the electroless plating solution prior to plating treatment. This avoids the undesirable phenomenon that bubbles of hydrogen gas evolving during electroless plating reaction prevent the elective progress of electroless plating and exacerbate the covering power of the metal to the particle surface. Then the powder particles coated with the silicon polymer can be uniformly surface coated with the metal film.

The plating temperature may be in the range of 15 to 100° C., desirably in the range of 40 to 95° C. which allows metal ions to diffuse at a higher rate in the bath, improves the covering power of plating metal, and reduces the loss of bath components and the loss of solvent by volatilization, and more desirably in the range of 65 to 85° C. At temperatures below 40° C., plating reaction may proceed very slowly, which is impractical. At temperatures above 95° C., bath control may become difficult because of vigorous evaporation of the solvent which is water.

In this way, the metal layer is formed on the powder particles. According to the invention, the third step is preferably followed by a fourth step of forming another metal layer. That is, an oxidation resistant noble metal layer is advantageously formed on the metal layer immediately after its formation, that is, before the metal layer is oxidized. In this embodiment, the metal layer and the noble metal layer are referred to as first metal layer and second metal layer, respectively.

The method for forming the second metal layer on the powder particles having the first metal layer already formed thereon may be electroless plating, electroplatiny or displacement plating. The electroless plating method is advantageously employed in the fourth step and may be conducted by the same technique as in the third step. The electroless plating solution used to form the second metal layer may be a solution prepared by the same method as above. The preferred metals to be added to the plating solution are gold, platinum, palladium and silver. These metals may be used alone or as alloys thereof, such as Au—Pd, Au—Pt, and Pd—Pt. Of these, gold is preferred for stability and silver is preferred for economy.

At the end of the third step, through washing is carried out to remove the unnecessary metal salt, reducing agent, complexing agent, surfactant and other additives. The metal layer preferably has a thickness of 0.01 to 10.0 µm, especially 0.1 to 2.0 µm. A thickness of less than 0.01 µm may fail to completely cover the particle surface or to provide satisfactory hardness and corrosion resistance. A thickness of more than 10.0 µm may be economically disadvantageous because a corresponding larger amount of the metal increases the cost and specific gravity.

In each of the second and third steps, it sometimes happens that some spots of the surface of each particle are left uncovered due to the agglomeration of particles. The agglomeration means that many powder particles gather together due to the secondary force. Since individual particles remain independent and not associated with each other, they separate by a slight force. If the silicon polymer-treated powder particles are in an agglomerated state in the second step, the metal colloid cannot deposit within agglomerates. If an agglomerated state exists in the third step, the plating metal cannot deposit within agglomerates. In either case, there result powder particles which are partially uncovered with metal, failing to develop excellent conductivity.

To prevent such inconvenience it is desirable in each step that the silicon polymer-treated powder particles be dispersed in a solution without agglomeration. The dispersing method may use an agitator having an agitating blade driven by a motor, a homogenizer having a rotor for effecting agitation with the aid of sonic energy, or a ultrasonic oscillator. Ultrasonic agitation is especially preferred. After the powder particles to be dispersed are admitted into water and mixed, in the case of a ultrasonic deaerator, a ultrasonic oscillating head thereof is placed in the fluid or in the case of a ultrasonic cleaner, the fluid is admitted into the cleaning tank. Ultrasonic frequency is generally in the range of 10 to 5,000 KHz, and desirably 20 to 200 kHz.

If desired, the metal-coated powder particles are finally heat treated at a temperature of at least 200° C. in an atmosphere of an inert gas (e.g., argon, helium or nitrogen) or a reducing gas (e.g., hydrogen, argon-hydrogen or ammonia). The inert or reducing gas heat-treating conditions include a temperature of 200° C. to 900° C. and a time of 1 minute to 24 hours and desirably a temperature of 200° C. to 500° C. and a time of 30 minutes to 4 hours. This heat treatment converts part or all of the reducing silicon polymer between the core particle and the metal layer into a ceramic so that the particles has higher heat resistance, insulation and adhesion. When the atmosphere is a reducing atmosphere such as hydrogen, the oxide in the metal layers can be decreased and the silicon polymer be converted into a stable structure whereby the powder particles possessing a stronger bond between core particle and metal and exhibiting higher conductivity are obtained.

In this way, there are obtained conductive particles having a low specific gravity X. Provided that the curable polymer (a) (e.g., organopolysiloxane A or reactive fluorinated polyether A') has a specific gravity Y, the difference in specific gravity between the curable polymer and the conductive particles, expressed as (Y-X), is within ±1.5, and desirably within ±1.3. The invention requires that those conductive particles meeting a specific gravity difference within this range account for at least 50% by weight, preferably at least 70% by weight, and more preferably at least 85% by weight of the entire conductive particles. If conductive particles having a specific gravity difference outside the range are included in a more proportion, that is, more than 50% by weight of the entire conductive particles, separation can occur between the conductive particles and the polymer with the passage of time so that the composition becomes unstable in curability and conductivity, failing to achieve the objects of the invention.

The remainder of conductive particles, that is, conductive particles having a specific gravity difference outside the range are, for example, copper, nickel and silver powder particles.

In the present invention, the amount of the conductive particles (b) blended may be determined as appropriate although it is preferably about 50 to 1,000 parts, and more preferably about 80 to 500 parts by weight per 100 parts by weight of the polymer (a).

EXAMPLE

Examples of the invention are given below by way of illustration and not by way of limitation. Note that the viscosity is a measurement at 25° C., Mn is number average molecular weight, and Me is methyl.

Reference Example 1
Preparation of Polysilane

Phenylhydrogenpolysilane (abbreviated as PPHS) was prepared by the following procedure. In an argon-purged flask, a diethyl ether solution of methyl lithium was added to a THF solution of bis(cyclopentadienyl) dichlorozirconium. After 30 minutes of reaction at room temperature, the solvent was distilled off in vacuum whereby a catalyst was formed in situ. Phenyltrihyurosilane was added to this in an amount of 10,000 mol per mol of the catalyst. The contents were heated and agitated for 3 hours at 100 to 150° C. and then for 8 hours at 200° C. The product was dissolved in toluene and washed with aqueous hydrochloric acid whereby the catalyst was deactivated and removed. Magnesium sulfate was added to this toluene solution to remove water. By filtration, PPHS having a weight average molecular weight of 1,200 and a glass transition temperature of 65° C. was collected in a substantially quantitative yield.

Reference Example 2
Preparation of Silver-plated Hollow Glass Beads

The hollow bead powder used herein was Cel-star PZ-6000 (Tokai Industry Co., Ltd., average particle size 40 µm, particle size distribution 10–60 µm, true specific gravity 0.75, made of glass) from which a fraction of particles with a size of 60 µm or greater had been removed by classification. A solution of 0.5 g of PPHS in 200 g of toluene was added to 100 g of the hollow bead powder, which was agitated for one hour. Fragments of beads which were broken during the agitation and settled down were removed. Using a rotary evaporator, the toluene was evaporated off at a temperature of 60° C. and a vacuum of 45 mmHg whereby the beads were dried.

The bead powder was made hydrophobic as a result of the polysilane treatment. The treated powder, 100 g, was admitted into 50 g of a 0.5% aqueous solution of surfactant Surfynol 504 (Nisshin Chemical Industry Co., Ltd.) and agitated, whereby the beads were dispersed in water.

For palladium treatment, 70 g of a 1% $PdCl_2$ aqueous solution (0.7 g of palladium chloride or 0.4 g of palladium) was added to 150 g of the water dispersion of the powder and agitated for 30 minutes, followed by filtration and water washing. This treatment yielded a powder which was colored blackish gray because palladium colloid adhered to the bead surface. Immediately after the powder was separated by filtration and washed with water, it was subjected to plating.

As a reducing solution for nickel plating, there was furnished 100 g of a mixed solution of 2.0 M sodium hypophosphite, 1.0 M sodium acetate and 0.5 M glycine diluted with deionized water. The palladium colloid-deposited powder was dispersed in the reducing solution for nickel plating together with 0.5 g of anti-foaming agent KS-538 (by Shin-Etsu Chemical Co., Ltd.). With agitation, the solution temperature was raised from room temperature to 65° C. A dilution of 2.0 M sodium hydroxide in deionized water was added dropwise to the reducing solution by carrying it with an air stream. At the same time, a dilution of 10 M nickel sulfate in the deionized water was added dropwise to the reducing solution by carrying it with a nitrogen gas stream. After a while, fine bubbles started to evolve, and the powder turned black, indicating that metallic nickel deposited on the bead surface. It was found that metallic nickel deposited on the entire surface of each bead.

The powder was dispersed in 100 g of a silver plating solution S-700 (High-Purity Chemical Laboratory Co., Ltd.). With agitation, the solution temperature was raised from room temperature to 70° C. After a while, fine bubbles started to evolve, and the powder turned silvery, indicating that silver deposited on the bead surface.

The treated beads floating in the plating solution were filtered, washed with water, and dried at 50° C. for 30 minutes. The beads were fired in a hydrogen-purged electric furnace at 300° C. for one hour. An observation under a stereomicroscope revealed that the powder consisted of beads which were covered with silver over their entire surface.

Properties of Conductive Particles having Hollow Bead-nickel-silver Structure

The particles of the conductive powder were spherical and silver colored in outer appearance upon microscopic observation and had a specific gravity of 1.28. The metal contents were silver 5% by weight and nickel 40 by weight.

The electric resistivity of the conductive powder was determined by introducing the powder into a cylindrical cell having four terminals, conducting a current of 1 to 10 mA across the terminals of 0.2 $cm^2$ area at the opposed ends from a current source SMU-257 (Keithley Co.), and measuring a voltage drop across the 0.2 cm spaced apart terminals at the center of the cylinder by means of a nanovolt meter Model 2000 (Keithley Co.). The resistivity was 3.5 mΩ·cm.

Reference Example 3
Preparation of Silver-plated Silica Powder

Instead of the hollow bead powder used in Reference Example 2, there was furnished a silica powder which had been classified so as to have substantially the same particle size (Mitsubishi Rayon Co., Ltd., average particle size 12 Mm, particle size distribution 1–30 μm, true specific gravity 2.2). Otherwise, the same operations as in Reference Example 2 were conducted. Plating reactions took place quickly, yielding a satisfactorily plated powder.

The particles of the conductive powder had a spherical shape, a silver colored outer appearance and a specific gravity of 3.0. The metal contents were silver 12% by weight and nickel 20% by weight. The resistivity was 1.2 mΩ·cm.

Reference Example 4
Preparation of Gold-plated Hollow Glass Beads

Instead of the silver plating solution, 100 g of a gold plating solution K-24N (High-Purity Chemical Laboratory Co., Ltd.) was used without dilution. Otherwise, the procedure of Reference Example 2 was repeated. The powder having metallic nickel deposited on the entire surface of beads was dispersed in the gold plating solution. With agitation, the solution temperature was raised from room temperature to 95° C. Fine bubbles started to evolve, and the powder turned golden, indicating that gold deposited on the bead surface.

The treated beads floating in the plating solution were filtered, washed with water, and dried at 50° C. for 30 minutes. The beads were fired in a hydrogen-purged electric furnace at 300° C. for one hour. An observation under a stereomicroscope revealed that the powder consisted of beads which were covered with gold over their entire surface.

The particles of the conductive powder were yellow colored in outer appearance upon microscopic observation and had a specific gravity of 1.17. The metal contents were gold 4% by weight and nickel 35% by weight. The resistivity was 3.8 mΩ·cm.

Comparative Reference Example 1
Preparation of Flat Silver Powder

In 40 ml of water was dissolved 20 g of silver nitrate. A 46% aqueous sodium hydroxide solution was added to the silver nitrate solution to form silver oxide, which precipitated in particulate form. The particulate silver oxide was reduced with formaldehyde, followed by several cycles of washing and filtration. There was obtained a particulate reduced silver powder having an average particle size of 1 μm. Using a methyl ethyl ketone solution of oleic acid as a lubricant, the reduced silver powder was milled in a ball mill. The silver powder surface treated with oleic acid was washed with methyl ethyl ketone, repeatedly washed with deionized water at 100° C. and finally dried. The resulting silver powder consisted of silvery colored flat particles having an average particle size of 8 μm, a specific gravity of 10.5, and a resistivity of up to 0.1 mΩ·cm.

Examples 1–6 & Comparative Examples 1–3

Conductive polymer compositions within the scope of the invention were prepared by intimately mixing components (a) and (b) shown below. The compositions were cured into rubber parts by heating at 150° C. for 30 minutes. The rubber parts were measured for hardness using a JIS A-scale hardness meter according to JIS K6301.

After the preparation, the compositions were held in a refrigerator. Immediately after the preparation (i.e., initial), after 24 hours, 100 hours and 200 hours of refrigerator storage, each composition was cured into a conductive rubber sheet of 1 mm thick by heating at 150° C. for 30 minutes. The rubber sheet was measured for volume resistivity by means of a volume resistivity meter Model K-705RL (Kyowa Riken Co., Ltd.)

The results are shown in Table 1.

The conductive powders (b) used herein are shown below.
(b-1) silver-nickel coated hollow glass powder (Reference Example 2)
(b-2) silver-nickel coated silica powder (Reference Example 3)
(b-3) gold-nickel coated hollow glass powder (Reference Example 4)
(b-4) flat silver powder (Comparative Reference Example 1)

The polymer compositions (a) used herein are shown below.

(a-1) Organopolysiloxane Composition A+B+C+D

Polymer composition (a-1) was prepared by intimately mixing (A) 100 parts by weight of a both end dimethylvinylsiloxy-blocked dimethylpolysiloxane having a viscosity of 2,000 centipoise (vinyl content 0.2 wt %), (B) 3 parts by weight of a both end trimethylsiloxy-blocked methylhydrogenpolysiloxane having a viscosity of 30 centipoise (Si—H bond hydrogen atom content 1.5 wt %), (D) 7 parts by weight of an organosilicon compound of formula (i), and (C) 0.3 part by weight (giving 5 ppm of platinum metal based on the entire composition) of a catalyst obtained by dispersing a chloroplatinic acid-vinylsiloxane complex in a thermoplastic silicone resin having a softening point of 80–90° C. and granulating the resin.

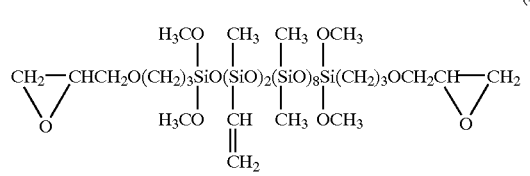

(a-2) Fluorinated Polyether Polymer Composition A'+B'+C'+D'

Polymer composition (a-2) was prepared by adding (B') 3 parts by weight of a fluorinated siloxane hydride of formula (iii), 0.5 part by weight of a 50% toluene solution of ethynyl cyclohexanol, (D') 1.0 part by weight of a tackifier of formula (iv), and 10 parts by weight of m-xylene hexafluoride to (A') 100 parts by weight of a fluorinated polyether polymer of formula (ii) (viscosity 4,400 cs, Mn 16,500, vinyl content 0.013 mol/100 g), uniformly agitating the contents, adding (C') 0.3 part by weight of the complex of chloroplatinic acid with 1,3-divinyl-1,1,3,3-tetramethyldisiloxane (platinum concentration 1.0% by weight), and intimately mixing the contents.

TABLE 1

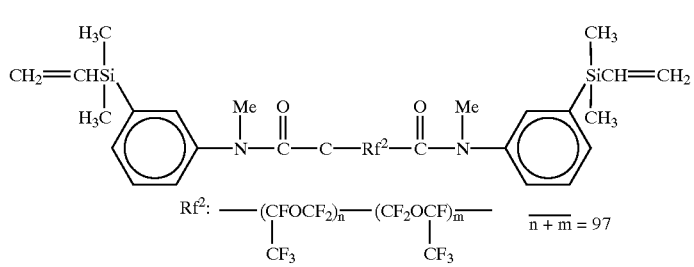

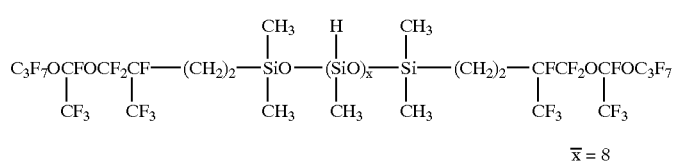

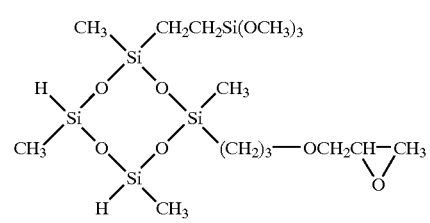

| Symbol | Component | Specific gravity | Example 1 | 2 | 3 | 4 | 5 | 6 | Comparative Example 1 | 2 | 3 |
|---|---|---|---|---|---|---|---|---|---|---|---|
| (b-1) | Ag-coated hollow glass beads | 1.3 | 150 | 100 | 150 | 150 | 0 | 0 | 0 | 0 | 0 |

TABLE 1-continued

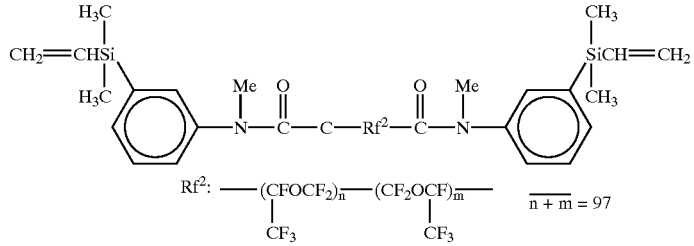

(ii)

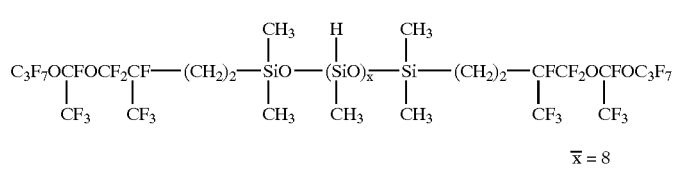

(iii)

$\overline{n+m} = 97$

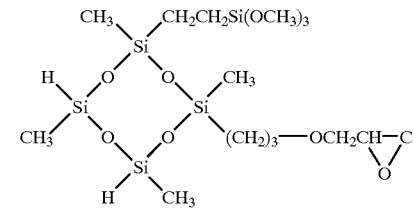

(iv)

$\overline{x} = 8$

| | | Specific | Example | | | | | | Comparative Example | | |
|---|---|---|---|---|---|---|---|---|---|---|---|
| Symbol | Component | gravity | 1 | 2 | 3 | 4 | 5 | 6 | 1 | 2 | 3 |
| (b-2) | Ag-coated silica beads | 3.0 | 0 | 0 | 0 | 0 | 250 | 0 | 300 | 0 | 0 |
| (b-3) | Au-coated hollow glass beads | 1.2 | 0 | 0 | 0 | 0 | 0 | 100 | 0 | 0 | 0 |
| (b-4) | flat Ag particles | 10.5 | 0 | 0 | 15 | 15 | 0 | 0 | 0 | 800 | 800 |
| (a) A | polydimethyl siloxane | 1.0 | 100 | 0 | 100 | 0 | 0 | 100 | 100 | 100 | 0 |
| A' | fluoroether | 1.8 | 0 | 100 | 0 | 100 | 100 | 0 | 0 | 0 | 100 |
| B | compound B | 1.0 | 3 | 0 | 3 | 0 | 3 | 3 | 3 | 3 | 0 |
| B' | compound B' | 1.6 | 0 | 3 | 0 | 3 | 0 | 0 | 0 | 0 | 3 |
| C | catalyst C | | 0.3 | | 0.3 | | 0.3 | 0.3 | 0.3 | 0.3 | |
| C' | catalyst C' | | | 0.3 | | 0.3 | | | | | 0.3 |
| D | compound D | 1.0 | 7 | 0 | 7 | 0 | 0 | 7 | 7 | 7 | 0 |
| D' | compound D' | 1.0 | 0 | 1 | 0 | 1 | 1 | 0 | 0 | 0 | 1 |
| Composition's specific gravity | | | 1.15 | 1.51 | 1.21 | 1.6 | 2.47 | 1.15 | 1.96 | 4.95 | 6.71 |
| Difference in specific gravity between b and A or A' | | | 0.3 | 0.5 | 0.3 | 0.5 | 1.2 | 0.2 | 2 | 9.5 | 8.7 |
| Cured properties | Hardness (JIS A) | | 70 | 74 | 73 | 77 | 72 | 70 | 70 | 73 | 78 |
| Volume resistivity ($\Omega$-cm) | Initial | | $1.00 \times 10^{-3}$ | $5.00 \times 10^{-4}$ | $6.00 \times 10^{-4}$ | $1.00 \times 10^{-4}$ | $5.00 \times 10^{-3}$ | $3.00 \times 10^{-3}$ | $1.00 \times 10^{2}$ | 1 k | $1.00 \times 10^{-2}$ |
| | 24 hr | | $3.00 \times 10^{-3}$ | $7.00 \times 10^{-4}$ | $7.00 \times 10^{-4}$ | $2.00 \times 10^{-4}$ | $6.00 \times 10^{-3}$ | $3.00 \times 10^{-3}$ | 100 k | 100 k | $1.00 \times 10^{00}$ |
| | 100 hr | | $4.00 \times 10^{-3}$ | $8.00 \times 10^{-4}$ | $7.00 \times 10^{-4}$ | $2.00 \times 10^{-4}$ | $6.00 \times 10^{-3}$ | $3.00 \times 10^{-3}$ | insulating | insulating | 100 |
| | 200 hr | | $5.00 \times 10^{-3}$ | $9.00 \times 10^{-4}$ | $7.00 \times 10^{-4}$ | $2.00 \times 10^{-4}$ | $6.00 \times 10^{-3}$ | $3.00 \times 10^{-3}$ | insulating | insulating | 1 k |

(A) both end dimethylvinylsiloxy-blocked dimethylpolysiloxane having a viscosity of 2,000 centipoise (vinyl content 0.2 wt %)
(A') fluorinated polyether polymer of formula (ii) (viscosity 4,400 cs, Mn 16,500, vinyl content 0.013 mol/100 g)
(B) both end trimethylsiloxy-blocked methylhydrogenpolysiloxane having a viscosity of 30 centipoise (Si—H bond hydrogen atom content 1.5 wt %)
(B') fluorinated siloxane hydride of formula (iii)
(C) chloroplatinic acid-vinylsiloxane complex (in an amount to give 5 ppm of platinum metal based on the composition)
(C') complex of chloroplatinic acid with 1,3-divinyl-1,1,3,3-tetramethyldisiloxane TABLE 1-continued (ii)

$$\text{CH}_2=\text{CHSi}(\text{CH}_3)_2-\text{C}_6\text{H}_4-\text{N}(\text{Me})-\text{C}(=O)-\text{C}-\text{Rf}^2-\text{C}(=O)-\text{N}(\text{Me})-\text{C}_6\text{H}_4-\text{Si}(\text{CH}_3)_2\text{CH}=\text{CH}_2$$

$$\text{Rf}^2: -(\text{CFOCF}_2)_n-(\text{CF}_2\text{OCF})_m- \quad \overline{n+m}=97$$
$$\phantom{\text{Rf}^2: -(}\text{CF}_3\phantom{\text{OCF}_2)_n-(}\text{CF}_3$$

(iii)

$$\text{C}_3\text{F}_7\text{OCFOCF}_2\text{CF}-(\text{CH}_2)_2-\text{SiO}-(\text{SiO})_{\overline{x}}-\text{Si}-(\text{CH}_2)_2-\text{CFCF}_2\text{OCFOC}_3\text{F}_7$$
with pendant $\text{CF}_3$, $\text{CF}_3$, $\text{CH}_3$ (×3), H, $\text{CH}_3$ (×3), $\text{CF}_3$, $\text{CF}_3$ $$\overline{x}=8$$

(iv)

Siloxane cage structure with substituents: $\text{CH}_3$, $\text{CH}_2\text{CH}_2\text{Si}(\text{OCH}_3)_3$, H, $\text{CH}_3$, $\text{CH}_3$, $(\text{CH}_2)_3-\text{OCH}_2\text{CH}-\text{CH}_3$ (with epoxide O), H, $\text{CH}_3$

|  |  |  | Example | | | | | | Comparative Example | | |
|---|---|---|---|---|---|---|---|---|---|---|---|
| Symbol | Component | Specific gravity | 1 | 2 | 3 | 4 | 5 | 6 | 1 | 2 | 3 |

(D) organosilicon compound of formula (i)
(D') siloxane hydride of formula (iv)

There has been described a conductive composition obtained by admixing a curable polymer with conductive particles having a small difference in specific gravity from the curable polymer for dispersing the particles in the polymer. The composition remains stable during storage, experiences a minimal change of curability with time, and cures into a conductive rubber which experiences a minimal change of volume resistivity with time. The composition can be printed to form a coating having a high conductivity and a smooth surface and is thus useful as a raw material to form reliable connectors used in variable resistors and distributing boards and as a conductive paste.

Japanese Patent Application No. 2001-216640 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A conductive composition comprising:
   (a) a curable polymer and
   (b) conductive particles in which those conductive particles coated with a metal on their outermost layer surface and having a specific gravity which differs within ±1.5 from the specific gravity of the curable polymer (a) account for at least 50% by weight of the entire conductive particles (b), wherein the metal-coated conductive particles are obtained by treating hollow or foamed particles with a reducing silicon polymer, followed by metalallization.

2. The conductive composition of claim 1 wherein the curable polymer (a) is an organopolysiloxane or perfluoropolyether polymer.

3. The conductive composition of claim 2 wherein the organopolysiloxane or perfluoropolyether polymer cures through hydrosilylation.

4. The conductive composition of claim 1 wherein the conductive particles (b) are blended in a silicone rubber composition comprising:
   (A) an organopolysiloxane having at least two alkenyl groups per molecule as the curable polymer (a),
   (B) an organohydrogenpolysiloxane having at least two silicon-bonded hydrogen atoms per molecule, and
   (C) a platinum group metal catalyst.

5. The conductive composition of claim 4, wherein the silicone rubber composition further comprises (D) and organosilicon compound having a silicon-bonded alkoxy group.

6. The conductive composition of claim 5, wherein the amount of component (D) is up to 20 parts by weight per 100 parts by weight of component (A).

7. The conductive composition of claim 4, wherein the organopolysiloxane (A) has a viscosity of 50 to 500,000 centipoise at 25° C.

8. The conductive composition of claim 4, wherein the organopolysiloxane (A) has a specific gravity in the range of 0.97 to 1.4 at 25° C.

9. The conductive composition of claim 4, wherein the component (B) is blended in such amounts that 0.5 to 10 silicon-bonded hydrogen atoms in component (B) are available per alkenyl group in component (A).

10. The conductive composition of claim 1 wherein the conductive particles (b) are blended in a composition comprising:

(A') a reactive fluorinated polyether polymer comprising fluorinated polyether units and having at least two aliphatic unsaturated hydrocarbon groups per molecule as the curable polymer (a), (B') a compound having at least two silicon-bonded hydrogen atoms per molecule, and (C) a platinum group metal catalyst.

11. The conductive composition of claim 10, wherein the catalyst (C) is at least one selected from the group consisting of platinum black, platinum carrying alumina powder, platinum-carrying silica powder, platinum-carrying carbon powder, chloroplatinic acid, an alcohol solution of chloroplatinic acid, a complex of chloroplatinic acid with olefin, a complex of chloroplatinic acid with vinylsiloxanes, a dispersion of platinum black in a thermoplastic organic resin, a dispersion of platinum carrying alumina powder in a thermoplastic organic resin, a dispersion of platinum-carrying silica powder in a thermoplastic organic resin, a dispersion of platinum-carrying carbon powder in a thermoplastic organic resin, a dispersion of chloroplatinic acid in a thermoplastic organic resin, a dispersion of a complex of chloroplatinic acid with olefin in a thermoplastic organic resin, a dispersion of a complex of chloroplatinic acid with vinylsiloxanes in a thermoplastic organic resin.

12. The conductive composition of claim 1, wherein the reducing silicon polymer is at least one selected from the group consisting of a polysilane, a polycarbosilane, a polysiloxane and a polysilazane having Si—Si bonds and/or Si—H bonds.

13. The conductive composition of claim 1, wherein the hollow or foamed particles are coated with at least one metal selected from the group consisting of gold, silver and nickel on the outermost layer surface.

14. The conductive composition of claim 1, wherein said conductive particles have an average particle size of 0.01 to 1000 µm.

15. The conductive composition of claim 1, wherein said conductive particles have a specific gravity of 0.01 to 3.0.

* * * * *